United States Patent
Kim

(10) Patent No.: US 9,865,738 B2
(45) Date of Patent: Jan. 9, 2018

(54) FIN FIELD EFFECT TRANSISTOR (FINFET) HAVING AIR GAP AND METHOD OF FABRICATING THE SAME

(71) Applicant: SAMSUNG ELECTRONICS CO., LTD., Suwon-si, Gyeonggi-Do (KR)

(72) Inventor: Jin Gyun Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/230,111

(22) Filed: Aug. 5, 2016

(65) Prior Publication Data

US 2017/0317212 A1 Nov. 2, 2017

Related U.S. Application Data

(60) Provisional application No. 62/329,548, filed on Apr. 29, 2016.

(51) Int. Cl.
*H01L 21/764* (2006.01)
*H01L 29/78* (2006.01)
*H01L 29/06* (2006.01)
*H01L 29/66* (2006.01)

(52) U.S. Cl.
CPC ........ *H01L 29/7851* (2013.01); *H01L 21/764* (2013.01); *H01L 29/0649* (2013.01); *H01L 29/66545* (2013.01); *H01L 29/66795* (2013.01)

(58) Field of Classification Search
CPC ............. H01L 21/76264; H01L 21/764; H01L 21/823431; H01L 21/823821; H01L 21/845; H01L 29/0649
See application file for complete search history.

(56) References Cited

U.S. PATENT DOCUMENTS

| | | | |
|---|---|---|---|
| 5,461,003 A | 10/1995 | Havemann et al. | |
| 5,814,555 A * | 9/1998 | Bandyopadhyay | H01L 21/02164 257/E21.279 |
| 6,077,767 A * | 6/2000 | Hwang | H01L 21/76802 257/E21.577 |
| 6,287,979 B1 | 9/2001 | Zhou et al. | |
| 6,635,967 B2 | 10/2003 | Chang et al. | |
| 6,780,753 B2 | 8/2004 | Latchford et al. | |
| 7,666,754 B2 | 2/2010 | Toma et al. | |

(Continued)

FOREIGN PATENT DOCUMENTS

KR  10-1005669  12/2010

*Primary Examiner* — Earl Taylor
(74) *Attorney, Agent, or Firm* — F. Chau & Associates, LLC

(57) ABSTRACT

A method of fabricating a fin field effect transistor (FinFET) is provided as follows. A fin structure is formed on a substrate. A gate pattern and a source/drain (S/D) electrode are formed on the fin structure. The gate pattern and the S/D electrode are spaced apart from each other. A blocking layer is on the fin structure to cover the gate pattern and the S/D electrode. A sacrificial pattern is formed on the blocking layer and between the gate pattern and S/D electrode. The sacrificial pattern has a first thickness and a first width. A capping layer is formed on the sacrificial layer. An air gap is formed by removing the sacrificial layer through the capping layer. The air gap is formed between the gate pattern and the S/D electrode and has the first thickness and the first width.

15 Claims, 13 Drawing Sheets

(56) References Cited

U.S. PATENT DOCUMENTS

| | | | |
|---|---|---|---|
| 7,892,966 B2 | 2/2011 | Won et al. | |
| 7,928,003 B2* | 4/2011 | Naik | H01L 21/31144 |
| | | | 438/624 |
| 8,232,618 B2* | 7/2012 | Breyta | H01L 21/31144 |
| | | | 257/506 |
| 8,471,343 B2* | 6/2013 | Doris | H01L 21/7682 |
| | | | 257/383 |
| 8,637,930 B2* | 1/2014 | Ando | H01L 29/785 |
| | | | 257/347 |
| 8,952,452 B2 | 2/2015 | Kang et al. | |
| 9,362,355 B1* | 6/2016 | Cheng | H01L 29/66742 |
| 9,484,250 B2* | 11/2016 | Leobandung | H01L 21/7682 |
| 9,716,158 B1* | 7/2017 | Cheng | H01L 29/4991 |
| 2008/0283937 A1* | 11/2008 | Shin | H01L 21/7682 |
| | | | 257/408 |
| 2009/0298282 A1* | 12/2009 | Yun | H01L 21/7682 |
| | | | 438/653 |
| 2012/0037962 A1* | 2/2012 | Breyta | H01L 21/31144 |
| | | | 257/288 |
| 2013/0049132 A1* | 2/2013 | Doris | H01L 21/7682 |
| | | | 257/383 |
| 2015/0372102 A1* | 12/2015 | Usami | H01L 29/41775 |
| | | | 257/327 |
| 2016/0268158 A1* | 9/2016 | Leobandung | H01L 21/7682 |
| 2016/0284697 A1* | 9/2016 | Yoon | H01L 27/088 |
| 2016/0284806 A1* | 9/2016 | Park | H01L 29/41791 |
| 2017/0033200 A1* | 2/2017 | Leobandung | H01L 21/7682 |
| 2017/0033223 A1* | 2/2017 | Leobandung | H01L 21/7682 |
| 2017/0053912 A1* | 2/2017 | Ching | H01L 27/0886 |
| 2017/0162650 A1* | 6/2017 | Cheng | H01L 29/0649 |

* cited by examiner

FIN FIELD EFFECT TRANSISTOR (FINFET) HAVING AIR GAP AND METHOD OF FABRICATING THE SAME

CROSS-REFERENCE TO RELATED APPLICATION

This application claims the benefit under 35 U.S.C. §119(e) to U.S. Provisional Patent Application No. 62/329,548, filed on Apr. 29, 2016 in the United States Patent & Trademark Office, the disclosure of which is incorporated by reference herein in its entirety.

TECHNICAL FIELD

The present inventive concept relates to semiconductor device having an air gap and a method of fabricating the same.

DISCUSSION OF RELATED ART

As more transistors are integrated in a chip, the size of each transistor shrinks and the distance between adjacent transistors is reduced. Parasitic capacitance between conductive materials connected to each transistor increases due to the shrink of each transistor in size.

SUMMARY

According to an exemplary embodiment of the present inventive concept, a method of fabricating a fin field effect transistor (FinFET) is provided as follows. A fin structure is formed on a substrate. A gate pattern and a source/drain (S/D) electrode are formed on the fin structure. The gate pattern and the S/D electrode are spaced apart from each other. A blocking layer is on the fin structure to cover the gate pattern and the S/D electrode. A sacrificial pattern is formed on the blocking layer and between the gate pattern and S/D electrode. The sacrificial pattern has a first thickness and a first width. A capping layer is formed on the sacrificial layer. An air gap is formed by removing the sacrificial layer through the capping layer. The air gap is formed between the gate pattern and the S/D electrode and has the first thickness and the first width.

According to an exemplary embodiment, a method of fabricating a vertical fin field effect transistor (V-FinFET) is provided as follows. An fin structure having a sidewall is formed on a substrate. A lower source/drain (S/D) is formed under the fin structure. A lower spacer, a gate pattern and an upper spacer are formed to surround a lower sidewall region, a center sidewall region and an upper sidewall region, respectively. An upper S/D is formed on an upper surface of the fin structure so that the lower S/D, the fin structure and the upper S/D are vertically stacked on each other. A lower S/D electrode, an upper S/D electrode and a gate electrode are formed to be electrically connected to the lower S/D, the upper S/D and the gate pattern, respectively. A blocking layer is formed to cover the upper S/D, the lower S/D electrode, the upper S/D electrode and the gate electrode. A sacrificial pattern having a first thickness and a first width is formed on the blocking layer and between the gate electrode and lower S/D electrode. A capping layer is formed on the sacrificial layer to cover the sacrificial layer. An air gap is formed by removing the sacrificial layer through the capping layer. The air gap is formed between the gate electrode and the lower S/D electrode and has the first thickness and the first width.

According to an exemplary embodiment of the present inventive concept, a fin field effect transistor (FinFET) is provided as follows. A gate pattern is disposed on a fin structure. A source/drain (S/D) electrode is disposed on the fin structure. A blocking layer covers the gate pattern and the S/D electrode. A capping layer covers the blocking layer. An air gap is interposed between the blocking layer and the capping layer and between the gate pattern and the S/D electrode. The air gap has sidewalls and a bottom surface defined by the blocking layer and an upper surface defined by the capping layer.

BRIEF DESCRIPTION OF DRAWINGS

These and other features of the present inventive concept will become more apparent by describing in detail exemplary embodiments thereof with reference to the accompanying drawings of which.

Figure 1:
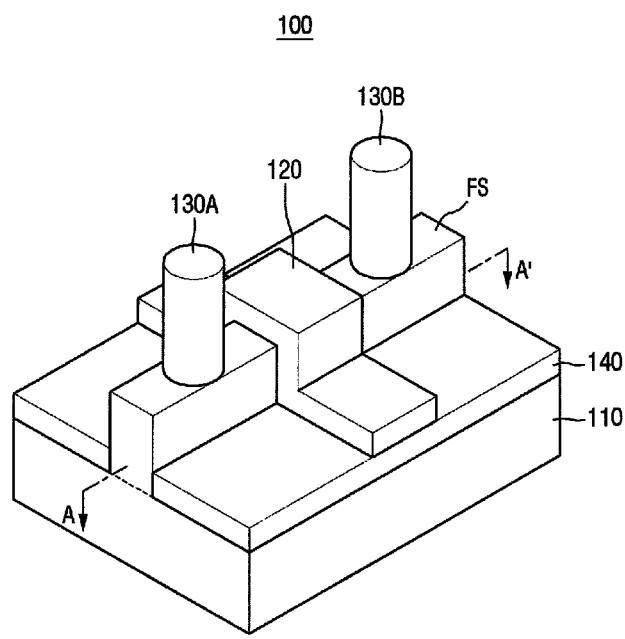
FIG. 1 shows a perspective view of a fin field effect transistor (FinFET) according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Figure 2:
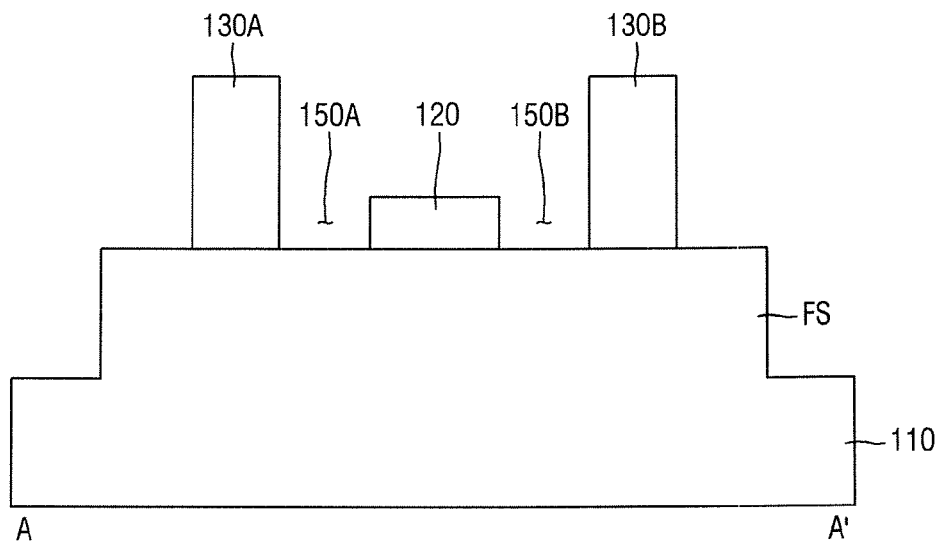
FIG. 2 shows a cross-sectional view taken along line A-A of FIG. 1.

FIGS. 1 and 2 show a semiconductor device 100 having an air gap between an gate pattern 120 and source/drain (S/D) electrodes 130A and 130B according to an exemplary embodiment. FIG. 1 shows a perspective view of the semiconductor device 100. FIG. 2 shows a cross-sectional view taken along line A-A of FIG. 1. The air gap may serve as an electrical isolation between the gate pattern 120 and the S/D electrodes 130A and 130B. For the convenience of description, the air gap is not shown in FIGS. 1 and 2. Instead, FIG. 2 shows air gap regions 150A and 150B where the air gap will be formed.

In FIG. 1, the semiconductor device 100 includes a substrate 110, a fin structure FS, a gate pattern 120. The semiconductor device 100 further includes S/D electrodes 130A and 130B. The S/D electrodes 130A and 130B may be connected to S/D regions (not shown here) formed in the fin structure FS. In an exemplary embodiment, the S/D regions may be formed in the fin structure using an ion implantation process. In an exemplary embodiment, the S/D regions may be formed using an epitaxial growth process.

In FIG. 2, air gap regions 150A and 150B are disposed between the gate pattern 120 and the S/D electrode 130A and between the gate pattern 120 and the S/D electrode 130B, respectively. The air gap region 150A is defined by an upper surface of the fin structure FS, a sidewall of the S/D electrode 130A and a sidewall of the gate pattern 120. In this case, the sidewall of the S/D electrode 130A and the sidewall of the gate pattern 120 face to each other. The air gap region 150B is defined by the upper surface of the fin structure FS, a sidewall of the S/D electrode 130B and an opposite sidewall of the gate pattern 120. In this case, the sidewall of the S/D electrode 130B and the opposite sidewall of the gate pattern 120 face to each other.

According to an exemplary embodiment, air gaps is formed within the air gap regions 150A and 150B using a sacrificial layer which is removed after filling the air gap regions 150A and 150B. In this case, the volume of the sacrificial layer filling the air gap regions 150A and 150B may determine the volume of the air gaps to be formed. Accordingly, the volume of the air gaps may be controlled by controlling the volume of the sacrificial layer filling the air gap regions 150A and 150B. In this case, a parasitic capacitance between the gate electrode and a S/D electrode may be precisely controlled because the volume of the sacrificial layer filling the air gap regions 150A and 150B may be precisely controlled using a deposition process for the sacrificial layer.

Hereinafter, a method of fabricating a semiconductor device with an air gap will be described with reference to FIG. 3, FIGS. 4 to 10. According to an exemplary embodiment, an air gap is formed within each of the air gap regions 150A and 150B of FIG. 2.

Figure 3:
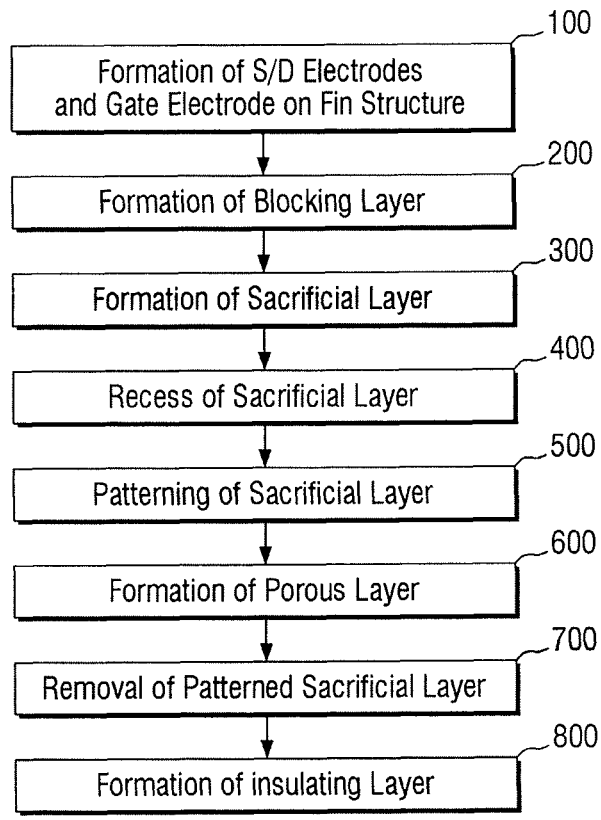
FIG. 3 is a flowchart of fabricating the FinFET of FIG. 1 according to an exemplary embodiment of the present inventive concept.

FIG. 3 is a flowchart of fabricating the semiconductor device 100 of FIG. 1 according to an exemplary embodiment of the present inventive concept. FIGS. 4 to 10 show cross-sectional views of the semiconductor device 100 formed according to the flowchart of FIG. 3.

Figure 4:
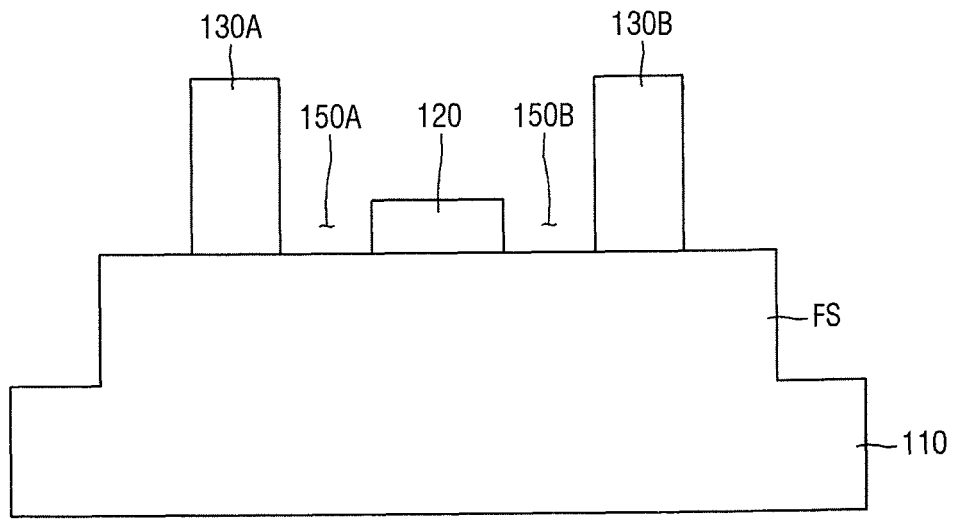
FIGS. 4 to 7, 9 to 11 show cross-sectional views of the FinFET formed according to the flowchart of FIG. 3.

FIG. 4 shows a fin structure FS, a gate pattern 120 and S/D electrodes 130A and 130B formed after step 100 of FIG. 1 is performed according to an exemplary embodiment of the present inventive concept. In an exemplary embodiment, the semiconductor device 100 may correspond to a Fin Field Effect Transistor (FinFET). For the convenience of description, a single FinFET is formed on the fin structure. The present inventive concept is not limited thereto. For example, two or more FinFETs may be formed on the fin structure FS. In this case, either the S/D electrode 130A or the S/D electrode 130B may be shared between two adjacent FinFETs.

The fin structure FS may be formed on the substrate 110 using an epitaxial growth process or formed by etching the substrate 110.

In FIG. 4, the gate pattern 120 and the S/D electrodes 130A and 130B are disposed on the fin structure FS.

The fin structure FS may be formed of silicon or a silicon-germanium alloy.

The gate pattern 120 may be formed of a conductive material including doped poly silicon or metal. When the gate pattern 120 may be formed of metal, a replacement-metal-gate process may be performed to form the gate pattern 120. The gate pattern 120 may include tungsten (W) or copper (Cu). Various barrier metal layer (not shown here) including TiN may be interposed between the gate pattern 120 and the fin structure FS.

The S/D electrodes 130A and 130B may be formed of a conductive metal including aluminum (Al), tungsten (W) or copper (Cu). Various contact resistance layer including a titanium silicide layer, for example, may be interposed between the fin structure FS and the S/D electrodes 130A and 130B to reduce contact resistance.

Figure 5:
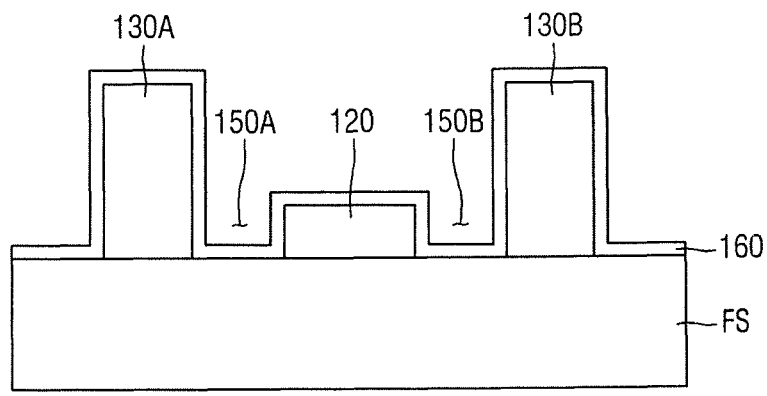

FIG. 5 shows a blocking layer 160 formed after step 200 is performed. The blocking layer 160 is formed on the resulting structure of FIG. 4. In an exemplary embodiment, the blocking layer 160 may be conformally formed using a deposition process. For example, the conformal deposition process may have a step coverage to the extent that the blocking layer 160 has a substantially uniform thickness along the surfaces of the gate pattern 120 and the S/D electrodes 130A and 130B. The blocking layer 160 may have a thickness not to completely fill the air gap regions 150A and 150B.

In an exemplary embodiment, the blocking layer 160 may be formed of silicon oxide ($SiO_2$), silicon nitride (SiN), silicon borocarbonitride (SiBCN) or silicon oxycarbonitride (SiOCN) that are formed using a chemical vapor deposition (CVD) process or an atomic layer deposition (ALD) process.

In an exemplary embodiment, the blocking layer 160 may serve to prevent a volatile byproduct generated in an ashing process from diffusing into the fin structure FS. The volatile byproduct and the ashing process will described with reference to FIG. 9.

Figure 6:
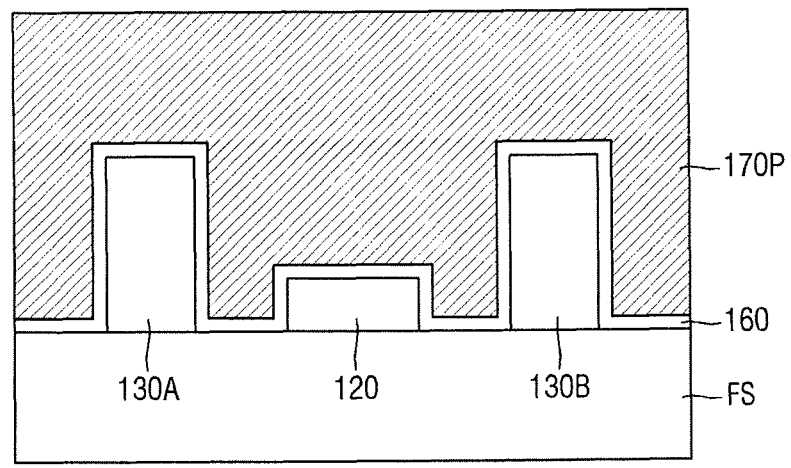

FIG. 6 shows a preliminary sacrificial layer 170p formed after step 300 is performed. The preliminary sacrificial layer 170p may be formed on the resulting structure of FIG. 5 using a deposition process including a spin coating method. The deposition process may be controlled so that the preliminary sacrificial layer 170p completely fills the air gap regions 150A and 150B of FIG. 5. In an exemplary embodiment, the preliminary sacrificial layer 170p may include an amorphous carbon layer (ACL) or a carbon spin-on-hardmask (C-SOH) layer. The carbon (C) of the preliminary sacrificial layer 170p may be oxidized to form a volatile carbon oxide in an aching process which will be described with reference to FIG. 9.

Figure 7:
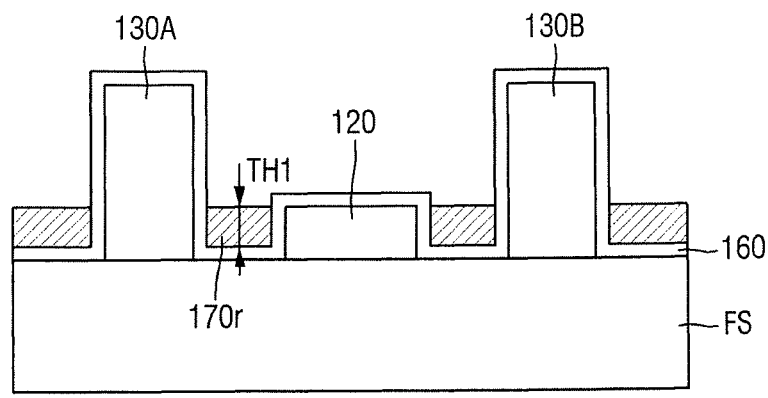

FIG. 7 shows a recessed sacrificial layer 170r formed after step 400 is performed. In step 400, the preliminary sacrificial layer 170p is recessed to form a recessed sacrificial layer 170r having a first thickness TH1. For example, the preliminary sacrificial layer 170p is recessed so that the blocking layer 160 is exposed through the recessed sacrificial layer 170r. In an exemplary embodiment, the recess of the preliminary sacrificial layer 170p may be performed using an etchback process. In the etchback process, a reactive ion etching (RIE) process may be used with an oxygen plasma.

Figure 8:
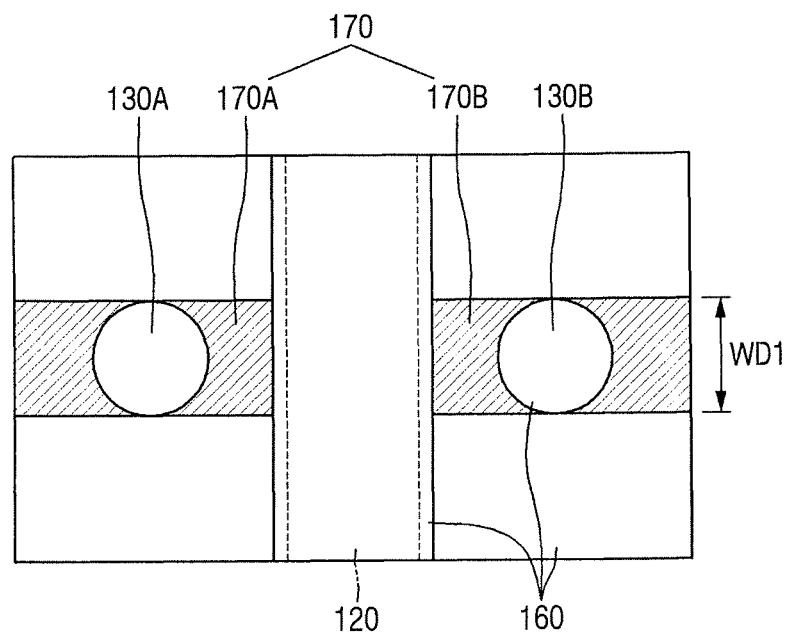
FIG. 8 shows a plan view of the FinFET formed according to the flowchart of FIG. 3.

FIG. 8 shows a plan view of sacrificial patterns 170A and 170B formed after step 500 is performed. The recessed sacrificial layer 170r of FIG. 7 may be patterned to the sacrificial patterns 170A and 170B each having a first width WD1. As such, each of the sacrificial patterns 170A and 170B may have the first thickness TH1 and the first width WD1.

In an exemplary embodiment, a photolithography process may be performed to pattern the recessed sacrificial layer 170r.

In an exemplary embodiment, the preliminary sacrificial layer 170p may be processed so that the sacrificial patterns 170A and 170B having the first thickness TH1 and the first width WD1 are formed in the air gap regions 150A and 150B. The volumes of the sacrificial patterns 170A and 170B may be controlled using the etchback process described with reference to FIG. 7 and the patterning process described with reference to FIG. 8. For example, the volumes of the sacrificial patterns 170A and 170B may be controlled to have the first thickness TH1 and the first width WD1.

According to an exemplary embodiment, the sacrificial patterns 170A and 170B may be removed to form air gaps using an ashing process. Accordingly, the volumes of the air gaps may be precisely controlled by controlling the thickness TH1 and width WD1 of the sacrificial pattern 170.

Figure 9:
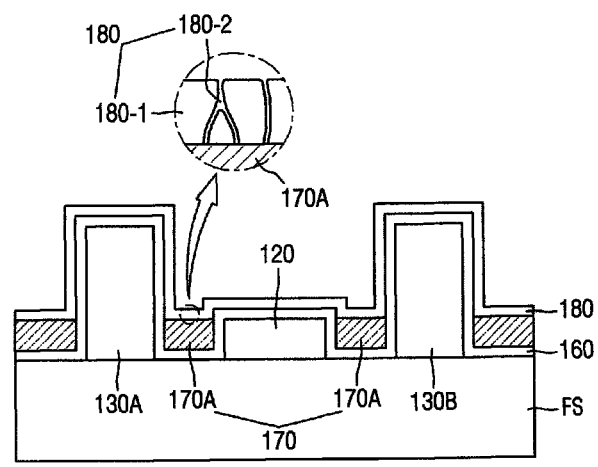

FIG. 9 shows a capping layer 180 formed after step 600 is performed. In an exemplary embodiment, the capping layer 180 may be porous to the extent that a volatile byproduct of the sacrificial patterns 170A and 170B may pass through the capping layer 180. For example, the volatile byproduct of the sacrificial patterns 170A and 170B may be removed from the sacrificial patterns 170A and 170B through the capping layer 180.

In an exemplary embodiment, the capping layer 180 is conformally formed on the sacrificial patterns 170A and 170B and the blocking layer 160.

In an exemplary embodiment, the capping layer 180 may include silicon oxide ($SiO_2$), silicon oxycarbide (SiOC), silicon boron carbide nitride (SiBCN), silicon oxycarbonitride (SiOCN) or a low-k dielectric material deposited by a deposition process including a CVD process or an ALD process. In an exemplary embodiment, the deposition process may be performed so that the capping layer 180 may be porous to the extent that a volatile byproduct of the sacrificial patterns 170A and 170B may pass through the capping layer 180 in an ashing process. For example, the deposition process may be performed at a room temperature. For example, the capping layer 180 may have a thickness to such extent that a volatile byproduct of the sacrificial pattern 170 may evaporate through the capping layer 180 in an ashing process. For example, the thickness may be about 70 Å or less than about 70 Å.

As shown in an expanded part A of FIG. 9, the capping layer 180 may include a grain 180-1 and a grain boundary 180-2. The grain boundary 180-2 may be an interface between two or more grains 180-2 through which a volatile byproduct of the sacrificial pattern 170 may diffuse.

In an exemplary embodiment, the blocking layer may be silicon nitride (SiN) and the capping layer may be silicon oxide ($SiO_2$).

Figure 10:
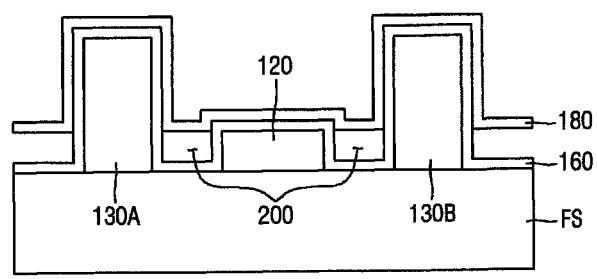

FIG. 10 shows air gaps 200 formed after step 700 is performed according to an exemplary embodiment of the present inventive concept. The sacrificial pattern 170 may be removed using an ashing process to form an empty space 200 defined by the blocking layer 160 and the capping layer 180. The empty space 200 serves as the air gaps to provide an insulation having a low parasitic capacitance between the gate pattern 120 and the S/D electrodes 130A and 130B to the semiconductor device 100.

The air gap 200 has sidewalls and a bottom surface defined by the blocking layer 160 and an upper surface defined by the capping layer 180.

In an exemplary embodiment, the ashing process may include an oxygen plasma ashing process. Oxygen plasma may react with the sacrificial patterns 170 to generate volatile byproducts including carbon monoxide (CO) or carbon dioxide ($CO_2$). The volatile byproducts may evaporate from the sacrificial pattern 170 through the capping layer 180. The blocking layer 160 may prevent the volatile byproducts from diffusing into the substrate 110.

Figure 11:
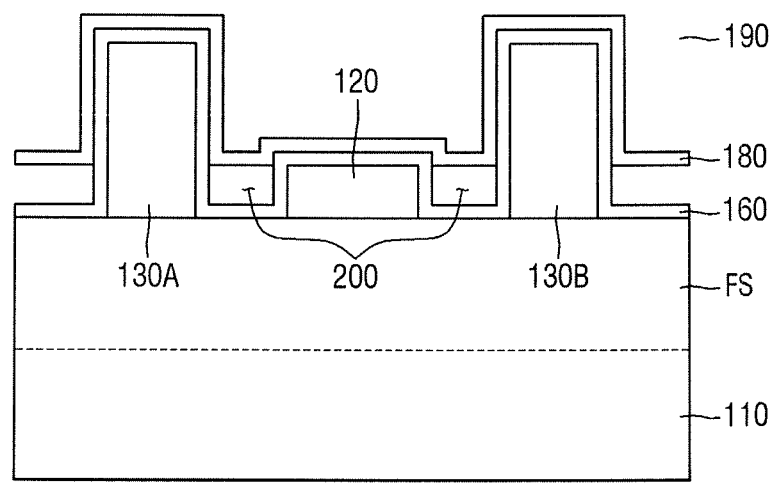

FIG. 11 shows an insulating layer 190 formed after step 800 is performed. The insulating layer 190 is disposed on the capping layer 180.

According to an exemplary embodiment, the air gap 200 may be formed using a sacrificial layer in a FinFET. The present inventive concept is not limited thereto. For example, the present inventive concept may be applied to a vertical FinFET (V-FinFET).

Hereinafter, the process steps described with respect to FIGS. 3 to 11 may be applied to the V-FinFET of FIG. 12 so that a V-FinFET may have an air gap between electrodes 170A, 180A and 190, for example.

The formation of the V-FinFET is described in U.S. patent application Ser. No. 15/229,881, filed on Aug. 5, 2016, which is incorporated by reference.

Figure 12:
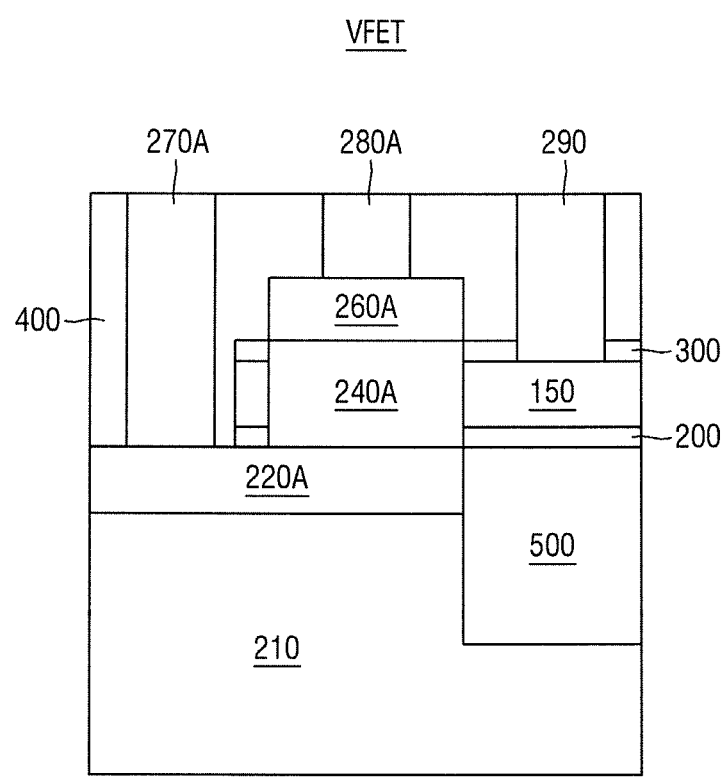
FIGS. 12 to 16 show cross-sectional views of a vertical fin field effect transistor (V-FinFET) formed according to the flowchart of FIG. 3.

FIG. 12 shows a V-FinFET VFET formed according to an exemplary embodiment of the present inventive concept.

In FIG. 12, a V-FinFET VFET includes a fin structure 240A, a lower source/drain (S/D) 220A and an upper source/drain (S/D) 220B which are vertically stacked on each other. The V-FinFET VFET further includes a lower spacer 200, a gate pattern 150 and an upper spacer 300 on a sidewall of the fin structure 240A.

The V-FinFET VFET includes an isolation pattern 500 to define the lower S/D 220A. The lower space 200 is formed on the isolation pattern 500.

The V-FinFET VFET is covered by an insulating layer 400. A lower S/D electrode 270A, an upper S/D electrode 280A and a gate electrode 290 are electrically connected to the lower S/D 220A, the upper S/D 260A and the gate pattern 150, respectively. For example, the electrodes 270A, 280A and 290 penetrates the insulating layer 400 to be in contact with the lower S/D 220A, the upper S/D 260A and the gate pattern 150, respectively. The gate electrode 290 further penetrates the upper spacer 300.

Figure 13:
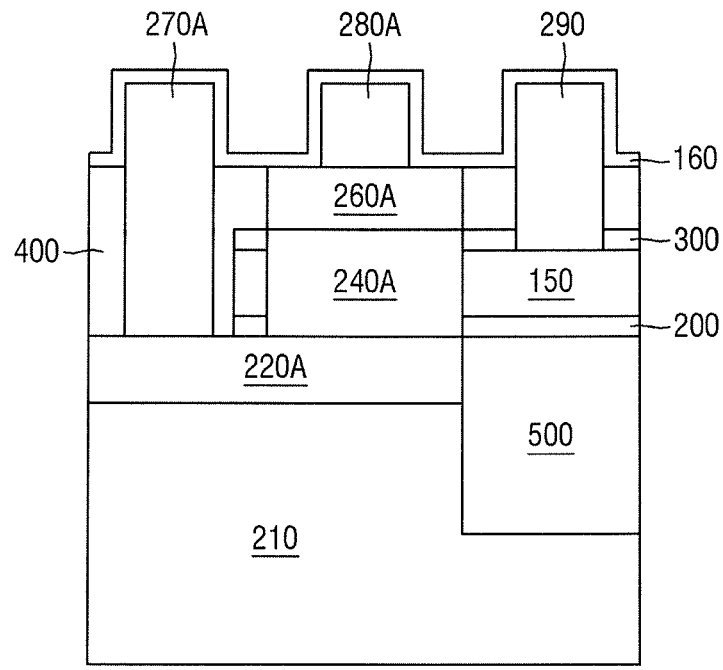

FIG. 13 shows a blocking layer 160 after step 200 of FIG. 3 is performed according to an exemplary embodiment of the present inventive concept. Before the step 200 is applied, the insulating layer 400 of FIG. 12 is recessed using an etchback process until an upper surface of the upper S/D 260A is exposed. In an exemplary embodiment, the etchback process may be performed so that the insulating layer 400 may remains at a predetermined thickness on the upper surface of the upper S/D 260A. After the recessing of the insulating layer 400, the blocking layer 160 is formed using a CVD process or an ALD process.

The blocking layer 160 may be formed of silicon oxide ($SiO_2$), silicon nitride (SiN), silicon borocarbonitride (SiBCN) or silicon oxycarbonitride (SiOCN).

The blocking layer 160 may serve to prevent a volatile byproduct generated in an ashing process from diffusing into the fin structure 240A. The volatile byproduct and the ashing process are described with reference to FIG. 9, and the detailed description thereof will be omitted herein.

Figure 14:
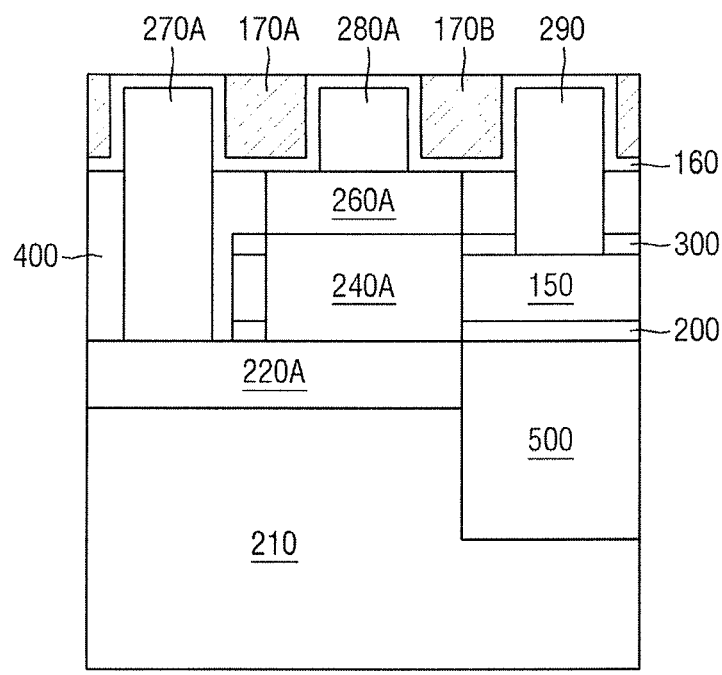

FIG. 14 shows sacrificial patterns 170A and 170B formed after steps 300 to 500 are performed according to an exemplary embodiment of the present inventive concept. As described with reference to FIGS. 6 to 8, a preliminary sacrificial layer (not shown here) may be recessed and patterned to have a predetermined volume.

Figure 15:
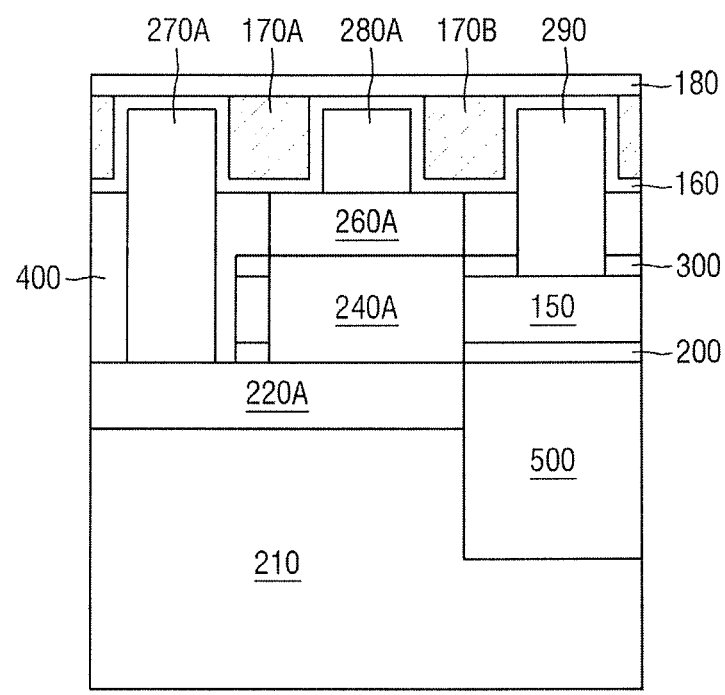

FIG. 15 shows a capping layer 180 formed after step 600 is performed.

In an exemplary embodiment, the capping layer 180 is conformally formed on the sacrificial patterns 170A and 170B and the blocking layer 160.

In an exemplary embodiment, the capping layer 180 may include silicon oxide ($SiO_2$), silicon oxycarbide (SiOC), silicon boron carbide nitride (SiBCN), silicon oxycarbonitride (SiOCN) or a low-k dielectric material deposited by a deposition process including a CVD process or an ALD process. In an exemplary embodiment, the deposition process may be performed so that the capping layer 180 may be porous to the extent that a volatile byproduct of the sacrificial patterns 170A and 170B may pass through the capping layer 180 in an ashing process. For example, the deposition process may be performed at a room temperature. For example, the capping layer 180 may have a thickness to such extent that a volatile byproduct of the sacrificial pattern may evaporate through the capping layer 180 in an ashing process.

Figure 16:
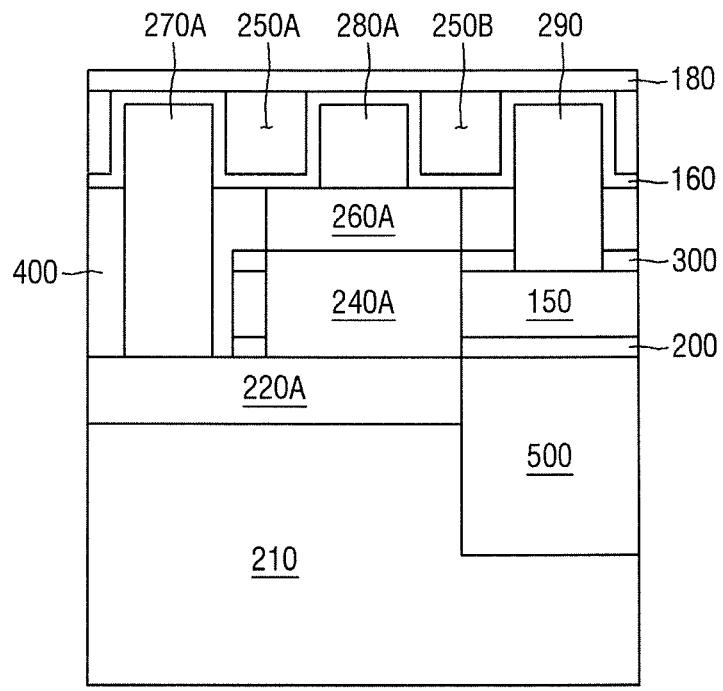

FIG. 16 shows air gaps 250A and 250B formed after step 700 is performed according to an exemplary embodiment of the present inventive concept. The sacrificial pattern 170 may be removed using an ashing process. In an exemplary embodiment, the ashing process may include an oxygen plasma ashing process. Oxygen plasma may react with the sacrificial patterns 170 to generate volatile byproducts including carbon monoxide (CO) or carbon dioxide ($CO_2$). The volatile byproducts may evaporate from the sacrificial pattern 170 through the capping layer 180. The blocking layer 160 may prevent the volatile byproducts from diffusing into the upper S/D 260A, the fin structure 240A or the lower S/D 220A.

The air gaps 250A and 250B are formed between a gate electrode 290 and a second S/D electrode 270B and between the second S/D electrode 270B and a first S/D electrode 270A, respectively. For the convenience of description, the air gaps 250A and 250B have different volumes. The present inventive concept is not limited thereto. For example, the air gaps 250A and 250B may have the same volume.

The air gaps 250A and 250B, as described with reference to FIGS. 12 to 16, may be formed using a preliminary sacrificial layer which is patterned to the sacrificial patterns 170A and 170B. The preliminary sacrificial layer may be recessed and patterned to form the sacrificial patterns 170A and 170B having a preliminary thickness and width. In an ashing process, the sacrificial patterns 170A and 170B may be removed to form the air gaps 250A and 250B, respectively.

According to an exemplary embodiment, the air gaps 250A and 250B may be formed between a blocking layer 160 and a capping layer 180. The blocking layer may serve to prevent a volatile byproduct in an ashing process, and the capping layer 180 may be porous to the extent that the volatile byproduct may evaporate through the capping layer 180.

Figure 17:
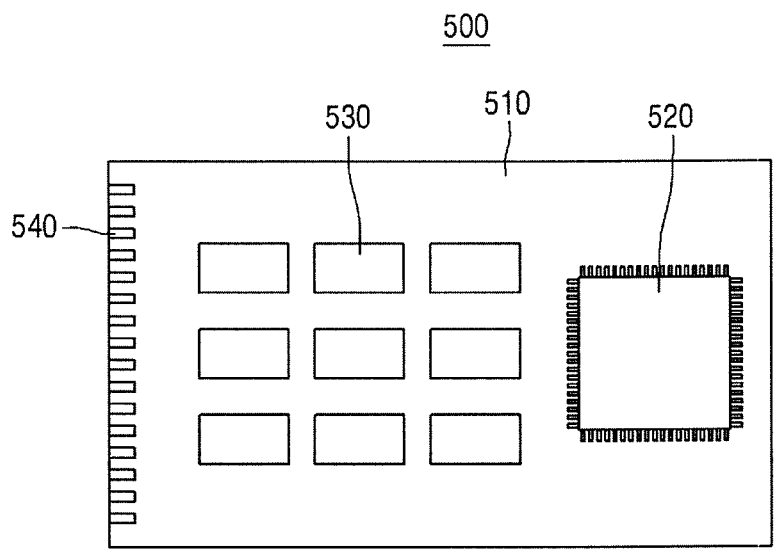
FIG. 17 is a semiconductor module having a FinFET or a V-FinFET fabricated according to an exemplary embodiment of the present inventive concept.

FIG. 17 is a semiconductor module having a FinFET or a V-FinFET fabricated according to an exemplary embodiment of the present inventive concept. Hereinafter, the FinFET or V-FinFET may be referred to as a semiconductor device.

Referring to FIG. 17, the semiconductor module 500 includes the semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 18:
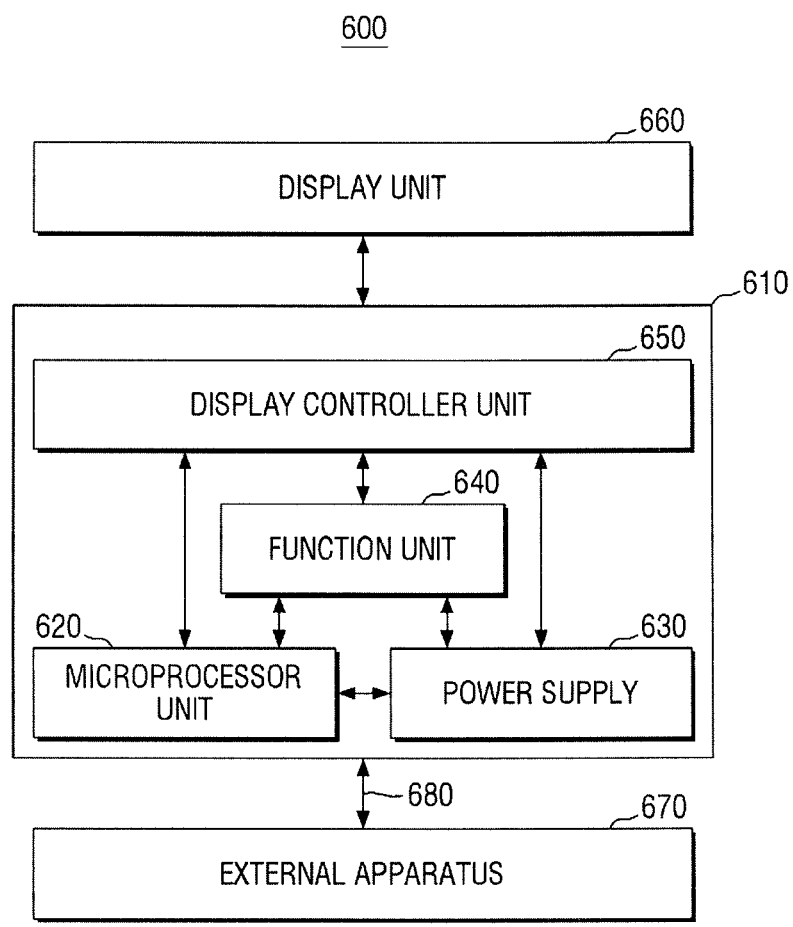
FIG. 18 is a block diagram of an electronic system having a FinFET or a V-FinFET according to an exemplary embodiment of the present inventive concept.

FIG. 18 is a block diagram of an electronic system having a semiconductor device according to an exemplary embodiment of the present inventive concept.

Referring to FIG. 18, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 19:
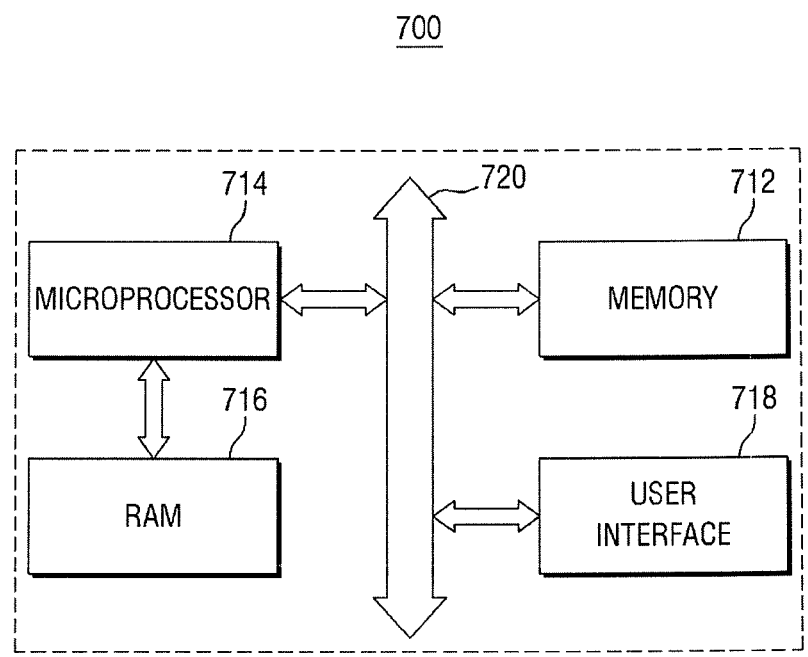
FIG. 19 is a block diagram of an electronic system having a FinFET or V-FinFET fabricated according to an exemplary embodiment of the present inventive concept.

FIG. 19 is a block diagram of an electronic system having a semiconductor device fabricated according to an exemplary embodiment of the present inventive concept.

Referring to FIG. 19, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a fin field effect transistor (FinFET), comprising:
    forming a fin structure on a substrate;
    forming a gate pattern and a source/drain (S/D) electrode on the fin structure, wherein the gate pattern and the S/D electrode are spaced apart from each other;
    forming a blocking layer on the fin structure, the blocking layer covering the gate pattern and the S/D electrode;
    forming a sacrificial pattern on the blocking layer and between the gate pattern and S/D electrode, the sacrificial pattern having a first thickness and a first width;
    forming a capping layer on the sacrificial pattern; and
    forming an air gap by removing the sacrificial pattern through the capping layer,
    wherein the air gap is formed between the gate pattern and the S/D electrode and has the first thickness and the first width.

2. The method of claim 1,
    wherein the forming of the sacrificial pattern includes:
    forming a preliminary sacrificial layer on the fin structure;
    recessing the preliminary sacrificial layer to form a recessed sacrificial layer having the first thickness; and
    patterning the recessed sacrificial layer to form the sacrificial pattern having the first width.

3. The method of claim 1,
    wherein the removing of the sacrificial pattern is performed by an ashing process.

4. The method of claim 3,
    wherein the ashing process includes an oxygen plasma ashing process.

5. The method of claim 3,
    wherein the capping layer is formed of silicon oxide (SiO$_2$), silicon oxycarbide (SiOC), silicon boron carbide nitride (SiBCN), silicon oxycarbonitride (SiOCN) or a low-k dielectric material.

6. The method of claim 3,
    wherein the capping layer is formed using a chemical vapor deposition or an atomic layer deposition performed at a room temperature.

7. The method of claim 6,
    wherein the capping layer is porous to the extent that a volatile byproduct evaporates through the capping layer.

8. The method of claim 3,
    wherein the blocking layer is formed of silicon oxide (SiO$_2$), silicon nitride (SiN), silicon borocarbonitride (SiBCN) or silicon oxycarbonitride (SiOCN).

9. The method of claim 8,
    wherein the blocking layer serves to prevent the volatile byproduct from being diffused into the fin structure.

10. The method of claim 2,
    wherein a volume of the air gap is substantially the same with a volume of the sacrificial pattern.

11. The method of claim 1,
    wherein the sacrificial layer includes an amorphous carbon layer (ACL) or a carbon spin-on-hardmask (C-SOH) layer.

12. A method of fabricating a vertical fin field effect transistor (V-FinFET), comprising:
    forming a fin structure having a sidewall on a substrate;
    forming a lower source/drain (S/D) under the fin structure;
    forming a lower spacer, a gate pattern and an upper spacer surrounding a lower sidewall region, a center sidewall region and an upper sidewall region, respectively;
    forming an upper S/D on an upper surface of the fin structure so that the lower S/D, the fin structure and the upper S/D are vertically stacked on each other;
    forming a lower S/D electrode, an upper S/D electrode and a gate electrode electrically connected to the lower S/D, the upper S/D and the gate pattern, respectively;
    forming a blocking layer to cover the upper S/D, the lower S/D electrode, the upper S/D electrode and the gate electrode;
    forming a sacrificial pattern on the blocking layer and between the gate electrode and the lower S/D electrode, the sacrificial pattern having a first thickness and a first width;
    forming a capping layer on the sacrificial pattern to cover the sacrificial pattern; and
    forming an air gap by removing the sacrificial pattern through the capping layer,
    wherein the air gap is formed between the gate electrode and the lower S/D electrode and has the first thickness and the first width.

13. The method of claim 12,
    wherein the removing of the sacrificial pattern is performed by an ashing process.

14. The method of claim 13,
    wherein the ashing process includes an oxygen plasma ashing process.

15. The method of claim 12,
    wherein a volume of the air gap is substantially the same with a volume of the sacrificial pattern.

* * * * *